United States Patent [19]

Yamauchi et al.

[11] Patent Number: 5,525,939
[45] Date of Patent: Jun. 11, 1996

[54] RECIRCULATING DELAY LINE DIGITAL PULSE GENERATOR HAVING HIGH CONTROL PROPORTIONALITY

[75] Inventors: Shigenori Yamauchi, Kariya; Takamoto Watanabe, Nagoya, both of Japan

[73] Assignee: Nippondenso Co., Ltd., Kariya, Japan

[21] Appl. No.: 501,269

[22] Filed: Jul. 12, 1995

Related U.S. Application Data

[63] Continuation of Ser. No. 318,556, Oct. 5, 1994, abandoned.

[30] Foreign Application Priority Data

Oct. 8, 1993 [JP] Japan .................................. 5-253023

[51] Int. Cl.⁶ .......................... H03B 5/24; H03K 3/012; H03K 3/027
[52] U.S. Cl. .......................... 331/57; 331/179; 327/107
[58] Field of Search .................. 331/57, 177 R, 331/179, 45; 327/105, 107, 172, 176, 291

[56] References Cited

U.S. PATENT DOCUMENTS

| | | | |
|---|---|---|---|
| 5,045,811 | 9/1991 | Lewis | 331/1 A |
| 5,331,294 | 7/1994 | Watanabe et al. | 331/57 |
| 5,394,114 | 2/1995 | Davis | 331/57 X |
| 5,416,444 | 5/1995 | Yamauchi et al. | 331/45 |
| 5,465,076 | 11/1995 | Yamauchi et al. | 331/179 |

FOREIGN PATENT DOCUMENTS

| | | |
|---|---|---|
| 440389 | 8/1991 | European Pat. Off. |
| 4327116 | 3/1994 | Germany |

OTHER PUBLICATIONS

Patent Abstract of Japan, vol. 17, No. 456(E–1418) Aug. 1993, re JP–A 05102801.

*Primary Examiner*—David Mis
*Attorney, Agent, or Firm*—Cushman, Darby & Cushman

[57] ABSTRACT

In a digital control pulse generator including a ring oscillator composed of multiple inversion circuits connected in a ring for circulating a pulse, a counter and selectors which turn data of a flip-flop to high when a counted value of the pulse from a terminal of the ring oscillator becomes a value corresponding to ten high order bits of control data, a pulse selector for taking out a clock of the flip-flop from the inversion circuit at the position specified by four bit control data and a delay line and logical product circuit which turn an output signal of the system to a high level for a predetermined time when the output of the flip-flop turns high, a register and adder accumulate the four low order bits of the control data every time the output signal turns high to update the data four bit data. As a result, the ring oscillator may be continuously operated and an oscillation cycle proportional to the control data may be set.

16 Claims, 6 Drawing Sheets

RECIRCULATING DELAY LINE DIGITAL PULSE GENERATOR HAVING HIGH CONTROL PROPORTIONALITY

This is a continuation of application Ser. No. 08/318,556, filed on Oct. 5, 1994, now abandoned.

BACKGROUND OF THE INVENTION

1. Field of the Invention

The present invention relates to a digital control pulse generator which allows control of a pulse generating cycle by digital data and which is applicable to a digital control oscillator which, for example, allows control of its oscillation cycle by digital data.

2. Description of Related Art

Conventionally a voltage controlled oscillator (known as a VCO) which allows control of an oscillation frequency thereof by an analog control voltage is used as a frequency variable oscillator in a PLL (Phase Locked Loop) of communication equipment, motor controlling equipment and other types of equipment.

However, because such a VCO requires particular resistors and capacitors to obtain a necessary central oscillation frequency, it has such problems that such resistors and capacitors have to be replaced in changing the central oscillation frequency, that a fine adjustment of the resistors and capacitors has to be made in order to maintain its accuracy (its controllability is not good), and that its power consumption is large because it uses an analog circuit.

In view of this, in Japanese Publication No. JP-A-5-102801 (Watanabe U.S. application Ser. No. 956,955), the applicant of the present invention has proposed a digital control oscillator comprising a pulse circulating circuit composed of an odd number of inversion circuits linked in a ring, for circulating a pulse signal, a switching circuit for increasing/decreasing the number of linked stages of the inversion circuits composing the pulse circulating circuit by even numbers of stages according to digital data from the outside, an output terminal for taking out the pulse signal circulating within the pulse circulating circuit, a counter for counting the pulse signal circulating within the pulse circulating circuit to detect that the pulse signal has circulated a number of times specified by the digital data from the outside and an output circuit for outputting a predetermined output signal at a timing wherein the pulse signal from the output terminal is inverted when the counter detects that the pulse signal has circulated by the number of times specified by the digital data from the outside.

In the apparatus proposed in Japanese Laid-Open Patent No. 5-102801, the period of time which the pulse signal requires to circulate the pulse circulating circuit once (pulse circulating time) T (T=x * Td) is determined by the number of linked stages of the inversion circuits composing the pulse circulating circuit and the inversion operating time Td of each inversion circuit, and the cycle by which the output signal is output from the output circuit, i.e. oscillation cycle HT (HT= x * Td * N), is determined by the pulse circulating time T and the count N of the pulse signal counted by the counter.

Accordingly, the apparatus proposed above allows an oscillation output of a desired cycle to be obtained easily by changing the number of linked stages x of the inversion circuits composing the pulse circulating circuit and the count value N of the counter respectively by digital data.

Further, if the number of stages of the inversion circuits for circulating the pulse signal is switched during the time when the pulse signal circulates within the pulse circulating circuit by setting the number of linked stages of the inversion circuits at x1 only when the pulse signal circulates the pulse circulating circuit in the first time and by setting the number of linked stages of the inversion circuits at x2 which is less than x1 during the time when the pulse circulates on and after the second time in digitally controlling the oscillation cycle, the apparatus proposed above is known to allow control of the oscillation cycle in detail by coarsely determining it by the count value N of the counter and then by finely adjusting it by the value of x1 because the oscillation cycle is Td * (x1+x2 * (N−1)).

Further, as such a digital control oscillator, one comprising a pulse circulating circuit composed of an odd number of inversion circuits linked in a ring, a counter for counting a pulse signal circulating within the pulse circulating circuit and for outputting a predetermined output signal when its count value reached a value specified by digital data from the outside, a delay circuit composed of a plurality of inversion circuits which temporarily stop the pulse circulating operation in the pulse circulating circuit when the output signal is output from the counter and starts the pulse circulating circuit again when a predetermined delay time has elapsed and a switching circuit for increasing/decreasing the number of linked stages of the inversion circuits within the delay circuit have been proposed as disclosed in U.S. Pat. No. 5,045,811.

The apparatus disclosed in U.S. Pat. No. 5,045,811 allows the output signal from the counter to be used as an oscillation output and its oscillation cycle is equal to a period of time in which a period of time determined by multiplying the pulse circulating time determined by the number of linked stages x3 of the inversion circuits composing the pulse circulating circuit and by the inversion operating time Td of each inversion circuit (x3 * Td) with the count N of the counter (x3 * Td * N) and a delay time (x4 * Td) determined by the number of linked stages x4 of the inversion circuits composing the delay circuit and the inversion operating time Td of each inversion circuit, i.e. Td * (x3 * N+x4) are added. Accordingly, this apparatus allows the oscillation cycle to be determined coarsely by the count N of the counter and allows it to be finely adjusted by setting the number of linked stages x4 of the inversion circuits composing the delay circuit.

However, the apparatus disclosed in Japanese Laid-Open Patent No. 5-102801 which the applicant of the present invention has proposed has the following problems.

That is, while the number of stages of the inversion circuits is changed, for example from x1 to x2 which is smaller than x1 during the time when the pulse signal circulates in the pulse circulating circuit as described above to digitally control the oscillation cycle in more detail in the apparatus described above, the number of linked stages of the inversion circuits has to be changed from x2 to x1 which conversely is larger than x2 when the output signal is output from the output circuit, i.e., when one cycle of the oscillation cycle passes.

However, because the input/output level of each inversion circuit to be increased cannot be predicted when the number of linked stages of the inversion circuits is increased, the pulse signal can be circulated only after stabilizing the pulse circulating circuit by extinguishing the pulse signal within the pulse circulating circuit once. Therefore, the operation of the pulse circulating circuit is forcibly stopped for a predetermined period of time per each cycle of the oscillation output and the pulse circulating circuit is operated again after completely extinguishing the pulse signal in the apparatus proposed in Japanese Patent Laid-Open No. 5-102801.

Because the stop and start of the pulse circulating circuit have to be repeated per each cycle of the oscillation cycle in the apparatus described above, the oscillation cycle HT does not become Td * (x1+x2 * (N−1) precisely but becomes a period of time in which a time Ta for temporarily stopping the pulse circulating circuit is added to that value. That is, although the oscillation cycle may be changed corresponding to digital data, the time Ta for temporarily stopping the pulse circulating circuit becomes an offset error in setting the oscillation cycle, making it impossible to set the oscillation cycle in proportion to digital data indicating the number of linked stages of the inversion circuits and the count of the counter. Further, because the pulse circulating circuit has to be temporarily stopped, there is a lower limit in setting the length of the oscillation cycle.

On the other hand, the prior art apparatus disclosed in U.S. Pat. No. 5,045,811 has a problem that because the count N of the counter and the number of linked stages x4 of the inversion circuits in the delay circuit for determining a delay time are independently controlled, the digital data from the outside which indicates an oscillation cycle cannot be used as it is to control the oscillation cycle and the digital data has to be converted once into data respectively indicating the count N and the number of linked stages x4.

SUMMARY OF THE INVENTION

It is a primary object of the present invention to obtain a digital control pulse generator which generates pulses continuously without resetting a delay circuit every time an oscillation cycle is changed.

It is a further object of the present invention to provide a digital control pulse generator which allows an oscillation cycle which is substantially proportional to digital data input from the outside to be obtained.

In a digital control pulse generator according to the first aspect of the present invention, nothing is stored as data in a memory means in the initial state and when the transmission cycle control data CDL which is the digital data indicating the connected position of inversion circuits starting from the start-up inversion circuit within a pulse running circuit is inputted from the outside in the beginning, the digital data CDL is output as it is to a pulse selecting means as first linked position input data CDLN indicating the connected position of the inversion circuits starting from the start-up inversion circuit within the pulse running circuit by a position data updating means.

If the starting control signal PA is inputted from the outside at this time, the start-up inversion circuit in the pulse running circuit starts the operation for inverting the input signal and an output of each inversion circuit composing the pulse running circuit is sequentially inverted, running the pulse signal on the pulse running circuit.

Then the pulse selecting means alternatively selects the inversion circuits for taking out the pulse signal from the pulse running circuit corresponding to the first linked position input data CDLN from the position data updating means and outputs the pulse signal from the selected inversion circuits.

When the pulse signal is output from the pulse selecting means, the output means outputs an apparatus predetermined output signal.

That is, the time from when the first linked position input data CDLN is inputted to the start-up inversion circuit in the pulse running circuit until when the apparatus output signal is output from the output means is obtained as a time in which a certain time (y * Td) determined by the total number of stages of the inversion circuits composing the pulse running circuit and an inversion operating time in each inversion circuit Td and a certain time (z * Td) determined by a number of linked stages of the inversion circuits z from the start-up inversion circuit to the inversion circuit from which the pulse signal is taken out and the inversion operating time in each inversion circuit Td are added (y * Td+z * Td).

When the output signal in the first cycle is output by the output means as described above, the memory means stores the first linked position input data CDLN inputted to the pulse selecting means at that time as the second linked position input data CDLN. Then the position data updating means adds the second linked position input data CDLN of the pulse selecting means stored in the memory means with the transmission cycle control data CDL which is the digital data indicating the connected position of the inversion circuits starting from the start-up inversion circuit within the pulse running circuit inputted from the outside and outputs the digital data after the addition as new first linked position input data CDL of the pulse selecting means.

Thereby, when the transmission cycle control data CDL is inputted on and after the next time (second time), the inversion circuits connected in the 2 * Z-th, 3 * z-th, ... stages starting from the start-up inversion circuit, i.e. the inversion circuit connected in the z-th stage starting from the inversion circuit from which the pulse signal has been taken out previously, is sequentially selected by the pulse selecting means as an inversion circuit from which the pulse signal is to be taken out this time and the apparatus output signal is output from the output means in every same constant time with the first time (y * Td+z * Td).

That is, the transmission cycle conntrol data CDL indicating the connected position of the inversion circuits starting from the start-up inversion circuit within the pulse running circuit inputted from the outside is sequentially accumulated every time the apparatus output signal is output from the output means, i.e. per one time, to use the accumulated data as the first linked position input data CDLN of the pulse selecting means. Thereby the connected position of the inversion circuits from which the pulse signal is taken out from the pulse running circuit are sequentially accumulated and updated, allowing the apparatus output signal to be outputted in exactly the same cycle without stopping the pulse running circuit.

As described above, the output cycle of the output signal, i.e., the transmission cycle of the digital control pulse generator, may be changed to an arbitrary value by changing the connected position of the inversion circuit from which the pulse signal is taken out by the digital data input from the outside.

In particular, because the digital control pulse generator allows the pulse running circuit to transmit without stopping it, the transmission cycle may be set substantially proportional to the value of digital data and the controllability is greatly enhanced. Further, because it is not necessary to stop the pulse running circuit, the transmission cycle may be set shorter.

It is preferred that the second position data updating means subtracts the second linked position input data CDLN by the number of the inversion circuits of the pulse running circuit to turn to the first linked position input data CDLN when the linked position of the specific inversion circuit indicated by the first linked position input data CDLN after the addition output from the position data updating means exceeds the linked position of the inversion circuit linked at the final stage of the pulse running circuit.

Thereby the number of inversion circuits composing the pulse running circuit may be prevented from greatly increasing even when an apparatus output having a long transmission cycle is desired.

In a digital control pulse generator according to the second aspect of the present invention, nothing is stored as data in a memory means in the initial state and when the transmission cycle control data CDL which is the digital data indicating the connected position of inversion circuits starting from the start-up inversion circuit within a pulse circulating circuit is inputted from the outside in the beginning, the digital data CDL is output as it is to a pulse selecting means as the first linked position input data CDLN indicating the connected position of the inversion circuits starting from the start-up inversion circuit within the pulse circulating circuit by a position data updating means.

If a starting control signal PA is inputted from the outside at this time, the start-up inversion circuit in the pulse circulating circuit starts the operation for inverting the input signal and an output of each inversion circuit composing the pulse circulating circuit is sequentially inverted, circulating the pulse signal on the pulse circulating circuit.

Then the pulse selecting means alternatively selects the inversion circuits for taking out the pulse signal from the pulse circulating circuit corresponding to the first linked position input data CDLN from the position data updating means and outputs the pulse signal from the selected inversion circuits. Further, a counting means counts the pulse signal output from the predetermined inversion circuits within the pulse circulating circuit and detects that its count value has reached the digital data CDH which indicates the number of circulations of the pulse signal within the pulse circulating circuit.

When the pulse signal is output from the pulse selecting means after the detection made by the counting means that the count value has reached the digital data CDH indicating the number of times of circulation, the output means outputs a predetermined apparatus output signal.

That is, the time from when the first linked position input data CDLN is inputted to the start-up inversion circuit in the pulse circulating circuit until when the apparatus output signal is output from the output means is the time of the first one cycle and this time is obtained as a time in which a certain time (y * Td * M) determined by the total number of stages of the inversion circuits composing the pulse circulating circuit, an inversion operating time in each inversion circuit Td and the number of times of circulation of the pulse signal counted by the counting means M and a certain time (z * Td) determined by a number of linked stages of the inversion circuits z from the start-up inversion circuit to the inversion circuit from which the pulse signal is taken out and the inversion operating time in each inversion circuit Td are added, i.e. (y * Td * M+ z * Td).

When the output signal in the first cycle is output by the output means as described above, the memory means stores the first linked position input data CDLN inputted to the pulse selecting means at that time as the second linked position input data CDLN. Then the position data updating means adds the second linked position input data CDLN of the pulse selecting means stored in the memory means with the transmission cycle control data CDL which is the digital data indicating the connected position of the inversion circuits starting from the start-up inversion circuit within the pulse circulating circuit inputted from the outside and outputs the digital data after the addition as new first linked position input data CDLN of the pulse selecting means.

Thereby, when the transmission cycle control data CDL is inputted on and after the second cycle, the inversion circuits connected in the 2 * Z-th, 3 * z-th, . . . stages starting from the start-up inversion circuit, i.e. the inversion circuit connected in the zth stage starting from the inversion circuit from which the pulse signal has been taken out previously, is selected sequentially by the pulse selecting means as an inversion circuit from which the pulse signal is to be taken out this time and the apparatus output signal is output from the output means in every same constant time with the first cycle (y * Td * M+z * Td).

Then, because a period of time until when the output signal is output next time is shortened by the time (y * Td) which the pulse signal takes to go around the pulse circulating circuit when the connected position of the inversion circuits indicated by the first linked position input data CDLN added by the position data updating means exceeds the inversion circuit connected immediately before the start-up inversion circuit, the count changing means increments by one the count (value of the transmission cycle control data CDH) of the pulse signal to be counted before the counting means implements the aforementioned detecting operation.

That is, the transmission cycle control data CDL indicating the connected position of the inversion circuits starting from the start-up inversion circuit within the pulse circulating circuit inputted from the outside is sequentially accumulated every time the apparatus output signal is output from the output means, i.e., per one cycle, to use the accumulated data as the first linked position input data CDLN of the pulse selecting means and when the inversion circuit selected by the pulse selecting means exceeds the inversion circuit connected immediately before the start-up inversion circuit, the count of the number of times of circulation of the pulse signal is incremented by one to carry the count. Thereby the connected position of the inversion circuits for taking out the pulse signal from the pulse circulating circuit are sequentially accumulated and updated, allowing the apparatus output signal to be outputted in exactly the same cycle without stopping the pulse circulating circuit.

As described above, the output cycle of the output signal, i.e. the transmission cycle of the digital control pulse generator, may be changed to an arbitrary value by changing the connected position of the inversion circuit from which the pulse signal is taken out and the number of times of circulation of the pulse signal counted by the counting means by the digital data input from the outside.

Moreover, the transmission cycle is determined by the number of circulations of the pulse signal within the pulse circulating circuit provided that the connected position of the inversion circuit from which the pulse signal is taken out is fixed and the more the number of times of circulation, the longer the transmission cycle of the output signal can be. Conversely, the transmission cycle of the output signal can be set longer corresponding to the circulating cycle of the pulse signal within the pulse circulating circuit by reducing the number of times of circulation, so that the transmission cycle of the pulse signal can be digitally controlled over a wide range with high resolution by coarsely determining the transmission cycle of the output signal by the number of circulations of the pulse signal and by finely adjusting it by changing the connected position of the inversion circuit for taking out the pulse signal from the pulse circulating circuit.

In particular, because the digital control pulse generator allows the pulse circulating circuit to oscillate without stopping it unlike the prior art apparatus described above, the transmission cycle may be set substantially proportional to the value of digital data and the controllability is greatly enhanced. Further, because it is not necessary to stop the pulse circulating circuit, the transmission cycle may be set shorter.

Here, the pulse circulating circuit may be composed of an odd number of inversion circuits or even number of inversion circuits.

However, when the pulse circulating circuit is composed of odd number of inversion circuits, the circuit structure becomes complex when low order n bits among digital data from the outside indicating the transmission cycle are used as the transmission cycle control data CDL indicating the connected position of the inversion circuit for taking out the pulse signal and higher order bits than the n-th bit are used as the transmission cycle control data CDH indicating the number of times of circulation of the pulse signal.

For example, when the pulse circulating circuit is composed of 31 inversion circuits and the inversion circuits for taking out the pulse signal are alternatively selected among each of the inversion circuits, a system converting circuit for converting the transmission cycle control data CDL and CDH from the outside into hentriacontaic (base 31) system data is required.

Although it is conceivable to arrange that the inversion circuits for taking out the pulse signal are alternatively selected from a predetermined $2^n$ of inversion circuits among the odd number of inversion circuits composing the pulse circulating circuit so it is not necessary to provide such system converting circuit, a problem arises in this case that an adjustment has to be made beforehand to set the inversion operating time of a particular inversion circuit to a different value from that of another inversion circuit, for example, in order to control the transmission cycle with a uniform resolution because all the inversion circuits to be selected cannot be set at equal intervals and the delay time between each inversion circuit to be selected cannot be fixed.

In the digital control pulse generator, the pulse circulating circuit may be composed of an even number of inversion circuits and the pulse selecting means is adapted so as to alternatively select the inversion circuit for taking out the pulse signal corresponding to n bits input data among the predetermined $2^n$ inversion circuits respectively connected at equal intervals within the pulse circulating circuit.

Further, because the pulse signal is taken out alternatively from the predetermined $2^n$ inversion circuits within the pulse circulating circuit, the low order n bits CDL among the transmission cycle control data CDL and CDH which are the digital data from the outside indicating the transmission cycle may be used as the digital data indicating the connected position of the inversion circuit as it is and the bits CDH of a higher order than the n-th bit of the digital data from the outside may be used as digital data indicating the number of times of circulation of the pulse signal as it is.

Furthermore, because the pulse circulating circuit is composed of an even number of inversion circuits and the pulse signal is taken out alternatively from the inversion circuits connected at equal intervals, the delay between each inversion circuit for taking out the pulse signal may be made uniform without adjusting the inversion operating time of the inversion circuit and the transmission cycle can be digitally controlled with a uniform resolution.

DETAILED DESCRIPTION OF THE PRESENTLY PREFERRED EMBODIMENTS

Figure 1:
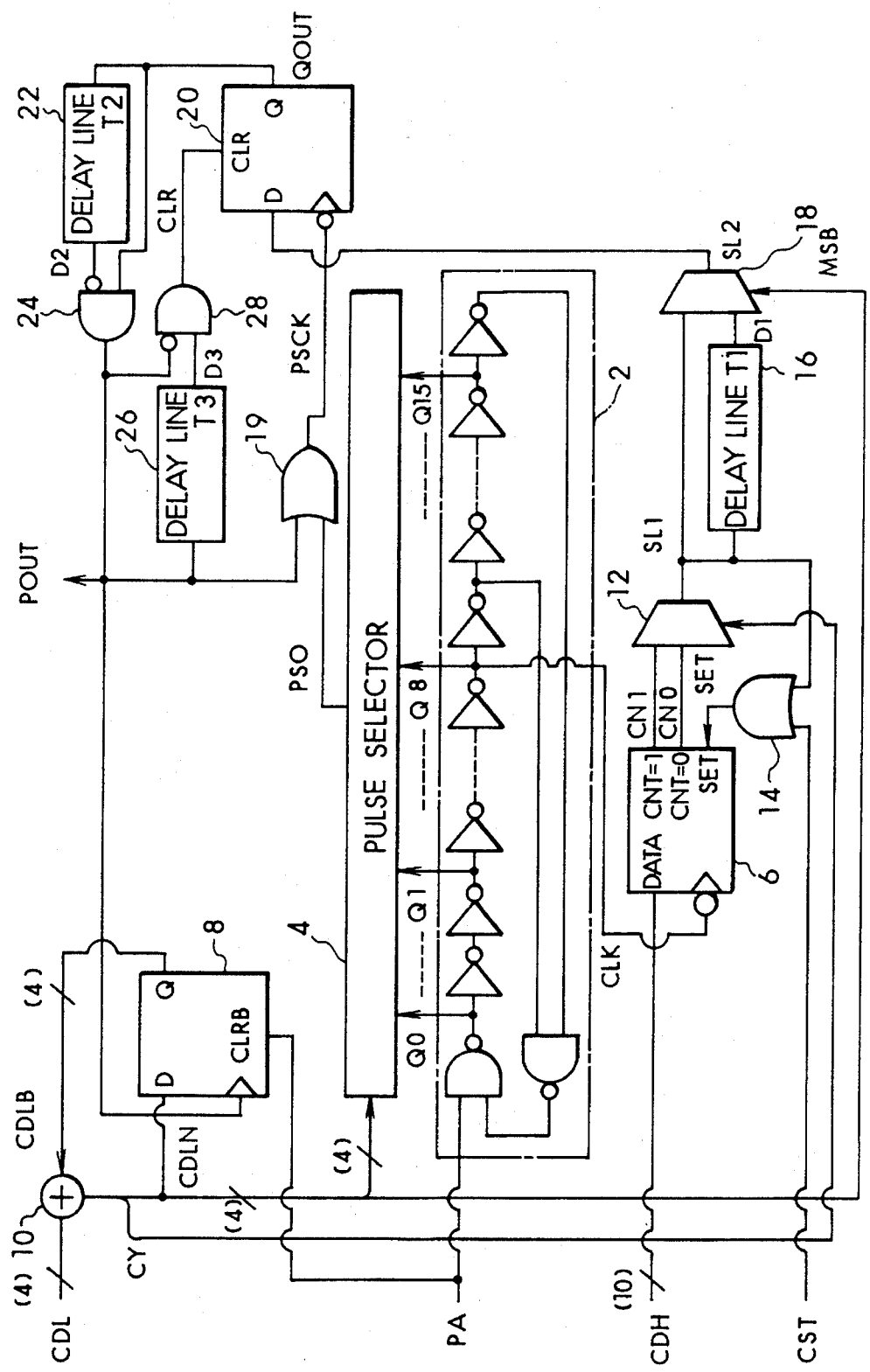
FIG. 1 is a block diagram showing a construction of a digital control pulse generator of a preferred embodiment of the present invention.

Referring now to the drawings, preferred embodiments of the present invention will be explained.

FIG. 1 is a block diagram showing a construction of a digital control pulse generator of a preferred embodiment applied to a digital control oscillator.

As shown in the figure, the digital control pulse generator in the present embodiment has a ring oscillator 2 as a pulse running or circulating circuit composed of 32 inversion circuits (inverter gates) in total connected in a ring as will be described later and circulates a pulse signal when a control pulse signal PA from the outside becomes High level. A pulse selector 4 as pulse selecting means is connected to take out the pulse signal from a predetermined inversion circuit in the ring oscillator 2 which corresponds to 4 bit control data CDLN and output the pulse signal as an output signal PSO. A down counter 6 as counting means is connected to down count at a timing of the trailing edge of a clock signal CLK from the ring oscillator 2 as high order 10 bit CDH are preset among 14 bit digital data (hereinafter called frequency control data) CDH (10 bit) and CDL (4 bit) which indicate a desired output cycle of an apparatus output signal POUT outputted from the digital control oscillator and turns an output signal CN1 to High level when the count value is 1 and turns an output signal CN0 to High level when the count value is 0. A register 8 as memory means is connected to be reset when the control signal PA is at Low level and latch the 4 bit control data CDLN inputted to the pulse selector 4 at a timing of the leading edge of the output signal POUT and outputs the latched data as 4 bit data CDLB. An adder 10 as position data updating means is connected to add the low order 4 bit CDL among the frequency control data CDH and CDL and 4 bit data CDLB from the register 8 and output a carry signal CY when the addition result exceeds "1111" and output the 4 bit data to the pulse selector 4 after the addition as control data CDLN. A selector 12 as count changing means is connected to select the output signal CN1 of the down counter 6 when the carry signal CY output from the adder 10 is Low level and select the output signal CN0 of the down counter 6 when the carry signal CY is High level to output as an output signal SL1. An OR gate 14 is connected to take a logical sum of an input signal from the outside CST and the output signal of the selector 12 SL1 to output its logical sum signal as a set signal SET of the down counter 6 described later. A delay line 16 is connected to delay the output signal SL1 of the selector 12 by a period of time T1 which the pulse signal takes to circulate through a half of the ring oscillator 2 to output a delay signal D1. A selector 18 is connected to select the output signal SL1 of the selector 12 when the MSB (most significant bit) of the control data CDLN output from the adder 10 is zero and select the delay signal D1 from the delay line 16 when the MSB of the control data CDLN is one to output as an output signal SL2. An OR gate 19 is connected to take a logical sum of the output signal PSO of the pulse selector 4 and the output signal POUT of the apparatus. A D type flip-flop (hereinafter referred to as a DFF) 20 with a clear terminal is connected to input the output signal SL2 of the selector 18 as data, input an output signal PSCK of the OR gate 19 as clock and latch data at a timing of the trailing edge of the output signal PSCK of the OR gate 19 for outputting a latch signal QOUT. A delay line 22 is connected to delay the latch signal QOUT from the DFF 20 by a predetermined period of time T2 for outputting a delay signal D2. An AND gate 24 is connected to take a logical product of a signal for which the signal level of the delay signal D2 is inverted and the latch signal QOUT from the DFF 20 to output the logical product signal as the output signal POUT of the apparatus. A delay line 26 is connected to delay the output signal POUT from the AND gate 24 by a predetermined period of time T3 to output a delay signal D3. An AND gate 28 is connected to take a logical product of a signal for which the signal level of the output signal POUT from the AND gate 24 is inverted and the delay signal D3 and output the logical product signal as a clear signal CLR of the DFF 20. The OR gate 19 is provided in order to avoid inputting clock to the DFF 20 while the output signal POUT of the digital control oscillator is High level. Further, the DFF 20, delay lines 22 and 28 and AND gates 24 and 28 correspond to the output means in the digital control oscillator of the present invention.

Figure 2:
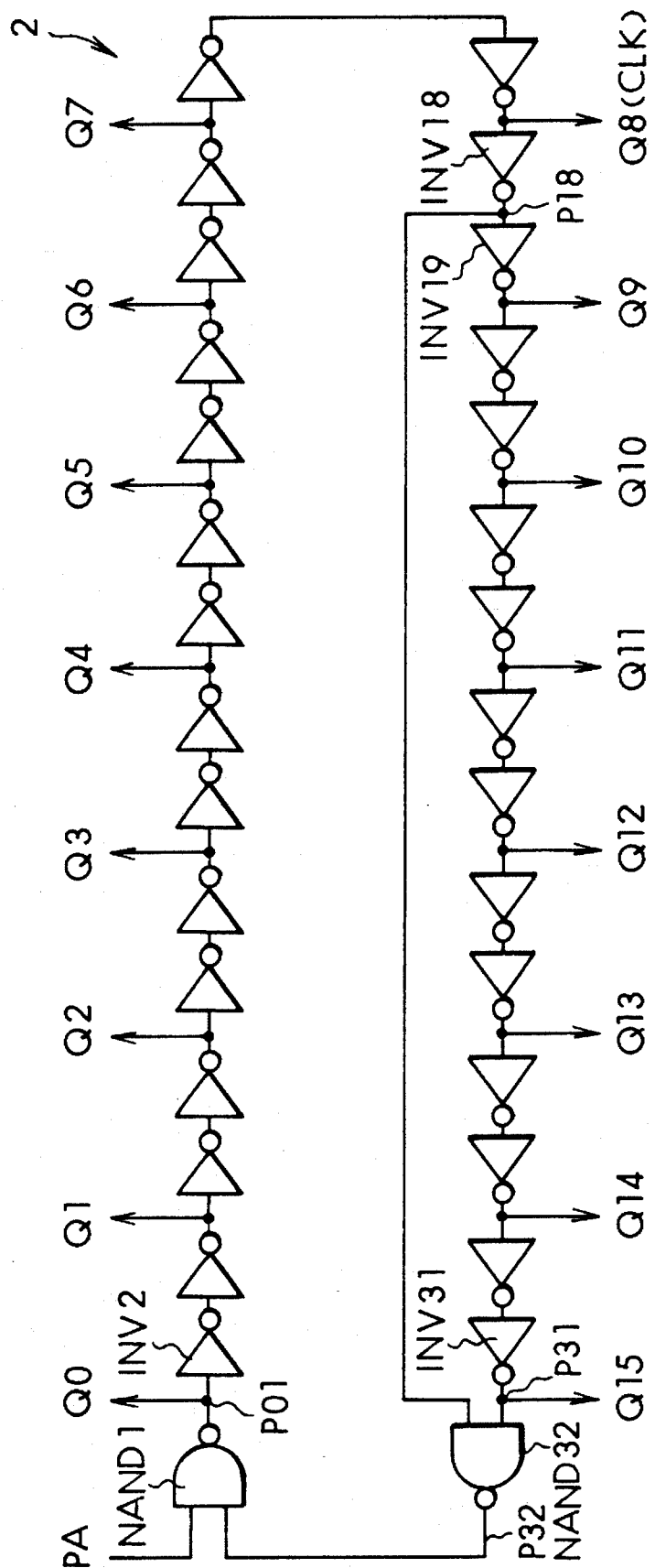
FIG. 2 is a structural diagram showing a construction of a ring oscillator according to the embodiment of the present invention.

The ring oscillator 2 is constructed as shown in FIG. 2.

As seen in the figure, the ring oscillator 2 is provided with two 2-input NAND gates (hereinafter simply referred to as a NAND gate) NAND 1 and NAND 32 and thirty inverters INV 2 through INV 30 as the inversion circuits. Each of these circuits are connected in series in a ring respectively from an output end of a preceding stage to an input end of a subsequent stage. The control signal PA from the outside is input to an input terminal of the NAND gate 1 as a start-up inversion circuit on the side not connected to the NAND gate NAND 32 (hereinafter this input terminal will be referred to as a start-up terminal) and the output signal of the inverter INV 18 is input to an input terminal of the NAND gate NAND 32 on the side not connected to the inverter INV 31. Output terminals Q0 through Q15 are provided respectively at output ends of the inversion circuits connected at the odd stages starting from the NAND gate NAND 1 and those output terminals Q0 through Q15 are connected sequentially to the pulse selector 4 as shown in FIG. 1. An output signal from the output terminal Q8 is output as the clock signal CLK of the down counter 6.

Figure 3:
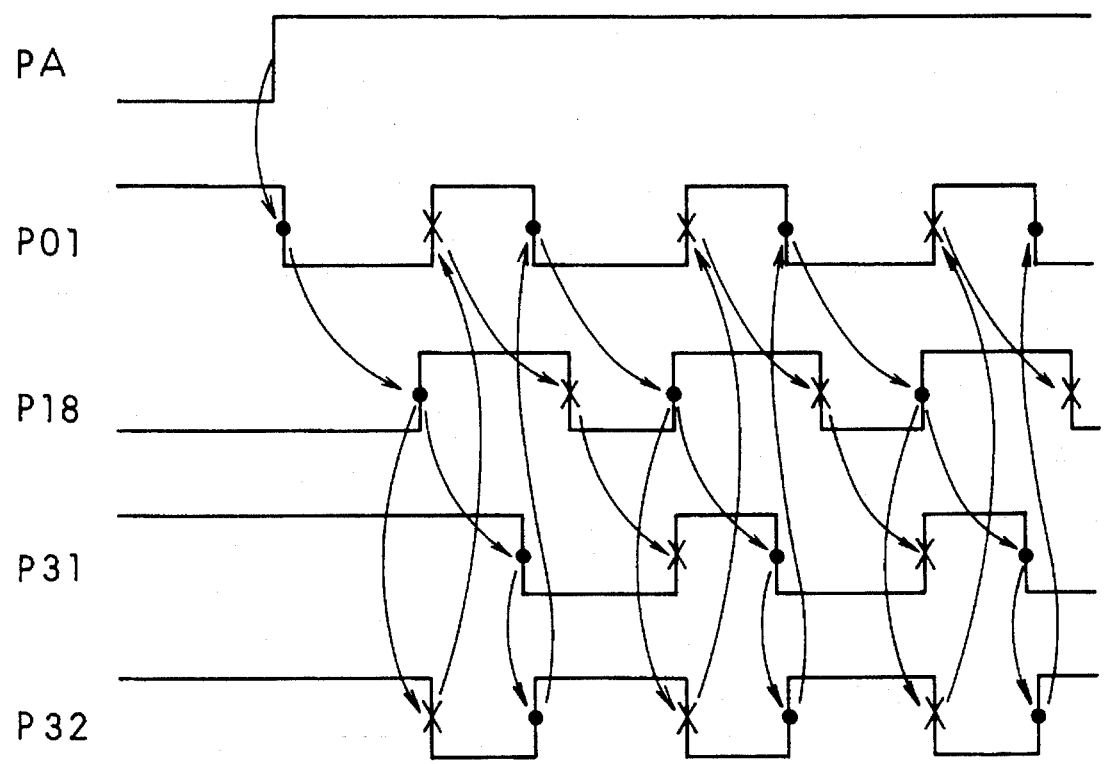
FIG. 3 is a time chart showing operations of the ring oscillator according to the embodiment of the present invention.

Referring now to FIG. 3, the operation of the ring oscillator 2 constructed as described above will be explained.

(a) When it is in the initial state, i.e. the control signal PA from the outside is Low level, an output P01 of the NAND gate NAND 1 is High level, so that outputs of the inverters in the even stages starting from the NAND gate NAND 1 remain Low level and the outputs of the inverters in the odd stages remain High level, thus stabilizing the apparatus. In the initial stage, because an output P18 of the inverter INV 18 input to a controlling terminal of the NAND gate NAND 32 is Low level, only the NAND gate NAND 32 outputs High level even though it is connected in the even stage. That is, it is constructed so that both of the input/output signals of the NAND gate NAND 1 become High level and so that the NAND gate NAND 1 starts an inverting operation when the control signal PA changes from Low level to High level.

(b) Next, when the control signal PA changes from Low level to High level, the output P01 of the NAND gate NAND 1 is inverted from High level to Low level, so that outputs of the succeeding inverters are sequentially inverted, changing the outputs of the odd stage inverters from High level to Low level and changing the outputs of the even stage inverters from Low level to High level. By the way, an edge of the pulse signal circulating sequentially on the ring oscillator 2 generated by such changes of the control signal PA and as trailing edge outputs of the odd stage inversion circuits and as leading edge outputs of the even stage inversion circuits will be referred to as a main edge and is denoted by dots in FIG. 3.

(c) When the main edge reaches the inverter INV 18 and the output P18 of the inverter INV 18 is inverted from Low level to High level, both the input signals of the NAND gate NAND 32 become High level since the output level of the inverter INV 31 is still at High level. Thereby, the NAND gate NAND 32 starts an inverting operation and its output is inverted from High level to Low level. An edge of the pulse signal circulating sequentially on the ring oscillator 2 as leading edge outputs of the odd stage inversion circuits and as trailing edge outputs of the even stage inversion circuits as the main edge is input from the controlling terminal to the NAND gate NAND 32 and is inverted by the NAND gate NAND 32 and will be referred to as a reset edge and is denoted by x in FIG. 3. The reset edge circulates on the ring oscillator 2 together with the main edge generated by the NAND gate NAND 1.

(d) The main edge after that is inverted and transmitted sequentially by each of the succeeding inverters after the inverter INV 18 and is input to the NAND gate NAND 32 when the output of the inverter INV 31 is inverted from High level to Low level. At this time, because the input signal of the controlling terminal of the NAND gate NAND 32, i.e. the output signal of the inverter INV 18, is High level, the main edge is inverted sequentially by the NAND gate NAND 32 and each of the inverters after the NAND gate NAND 1 and is transmitted on the ring oscillator 2.

The reason why the output signal of the inverter INV 18 is still High level when the main edge arrives at the NAND gate NAND 32 via the inverters INV 19 through 31 is because the number of inverters from the NAND gate NAND 32 to the inverter INV 18 including the NAND gate is 19 while the number of inverters between the inverter INV 19 and 31 is 13 and thereby the main edge is input to the NAND gate NAND 32 faster than the reset edge transmitted from the NAND gate NAND 32 to the inverter INV 18.

(e) On the other hand, the reset edge generated by the NAND gate NAND 32 arrives at the inverter INV 18 again via each of the inverters including the NAND gate NAND 1 and inverts the signal level of the controlling terminal of the NAND gate NAND 32 from High level to Low level. However, because the input signal of the NAND gate NAND 32 from the inverter INV 31 has been already turned to Low level by the main edge, the output of the NAND gate NAND 32 is not changed and the reset edge is transmitted sequentially to the NAND gate NAND 32 from the inverter INV 18 via a normal route of the inverter INV 19 through 31.

(f) When the reset edge arrives at the inverter INV 31, the input signal of the NAND gate NAND 32 from the inverter INV 31 is inverted from Low level to High level. Almost at the same time, the main edge arrives at the inverter INV 18 and the input signal of the controlling terminal of the NAND gate NAND 32 is also inverted from Low level to High level. This is because the total number of the inversion circuits which the both edges pass through before arriving at the NAND gate NAND 32 is 50 and is exactly equal; while the main edge starts from the NAND gate NAND 1 and arrives at the inverter INV 18 going around the ring oscillator 2 on the normal route and passing through the NAND gate NAND 1 again, the reset edge is generated by the start of the inverting operation of the NAND gate NAND 32 as the main edge arrives at the inverter INV 18 and then goes around the ring oscillator 2 by the normal route.

Here the ring oscillator 2 of the present embodiment is preset so that the inversion response time of the odd stage inverters thereof becomes faster for the trailing edge output rather than for the leading edge output and conversely, the inversion response time of the even stage inverters becomes faster for the leading edge output rather than for the trailing edge output and so that the reset edge arrives at the NAND gate NAND 32 slightly earlier than the main edge.

Accordingly, because the input signal of the controlling terminal of the NAND gate NAND 32 is still Low level even when the output of the inverter INV 31 is inverted from Low level to High level by the reset edge, the output of the NAND gate NAND 32 is not inverted and when the main edge arrives slightly late at the inverter INV 18 and the input signal of the controlling terminal of the NAND gate NAND 32 is inverted from Low level to High level, the output of the NAND gate NAND 32 is inverted from High level to Low level. Thus the reset edge is distinguished once here and is generated again by the main edge. The output of the NAND gate NAND 32 being inverted by the main edge inputted from the controlling terminal is exactly the same operation as that described in (c).

(g) After that, the operations (d) through (f) are repeated. The reset edge is regenerated every time the main edge circulates once and is circulated on the ring oscillator 2 together with the main edge. When the control signal PA becomes Low level, the series of operations is stopped, returning to the initial state in (a) above.

Although the level of input/output of each inversion circuit becomes different and stabilizes the whole circuit when an even number of inversion circuits are linked in a ring, two pulse edges (i.e. the main edge and reset edge) whose generation timings are different are circulated in the same round in the ring oscillator 2 of the present invention, so that the output of the NAND gate NAND 1 is inverted by the reset edge before the main edge which it has generated comes back and the output of the NAND gate NAND 32 is inverted by the main edge before the reset edge which it has generated comes back, thus keeping the whole circuit unstable and circulating the pulse signal all the time. Then a pulse signal having one period 32 times of the inversion operating time Td in each inversion circuit (32 * Td) is output respectively from each output terminals Q0 through Q15.

The pulse selector 4 is a known selector circuit for inputting the output signals respectively from the output terminals Q0 through Q15 provided on the ring oscillator 2 and for selecting and outputting a signal having a number which corresponds to a value specified by 4 bit control data CDLN among each of the signals.

Accordingly, when "0001" which indicates 1 is input as the control data CDLN for example, a pulse signal from the output terminal Q1 is output as an output signal PSO and when "1111" which indicates 15 is inputted as the control data CDLN, a pulse signal from the output terminal Q15 is output as an output signal PSO.

The down counter 6 is configured as a known counter provided with a set terminal SET as shown in FIG. 1 and a set signal SET output from the OR gate 14 is input to the set terminal SET. If a clock signal CLK (a pulse signal from the output terminal Q8 on the ring oscillator 2) decays when the set signal SET is at High level, a high order 10 bit CDH of the frequency control data is preset. On the other hand, when the set signal is at Low level, the count value is decreased one by one every time the clock signal CLK from the ring oscillator 2 rises, turning the output signal CN1 to High level when the count value is 1 and turning the output signal CN0 to High level when the count value is 0.

Next, an initial setting procedure which is implemented before oscillation of the digital control pulse generator constructed as described above will be explained.

This initial setting is implemented in the following order immediately after turning power on.

At first, as the control signal PA is turned to Low level, the input signal CST is turned to High level to input the frequency control data CDH and CDL.

Because the control signal PA is at Low level in this initial state, the pulse circulating operation of the ring oscillator 2 is stopped. Further, because the register 8 is reset, 4 bit data CDLB output from the register 8 become all zero and the control data CDLN output from the adder 10 coincides with the low order 4 bit CDL of the frequency control data. The carry signal CY of the adder 10 is Low level at this time. Accordingly, because the low order 4 bit CDL of the frequency control data is input to the pulse selector 4 in this initial state, the pulse selector 4 outputs a signal that corresponds to the value of the low order 4 bit CDL of the frequency control data among the output signals of the output terminals Q0 through Q15 provided on the ring oscillator 2.

Further, because the input signal CST is High level, the set signal SET output from the OR gate 14 becomes High level and the down counter 6 is put into a state in which it waits to preset the high order 10 bit CDH of the frequency control data at a timing when the clock signal CLK from the ring oscillator 2 decays, i.e. a preset standby state. The DFF 20 is reset and the output signal POUT becomes Low level in this initial state.

When the control signal PA is changed from Low level to High level after thus inputting the frequency control data CDH and CDL, the ring oscillator 2 starts the pulse signal circulating operation as described above. Then when the main edge is output from the output terminal Q8, the clock signal CLK input to the down counter 6 decays, so that the high order 10 bit CDH of the frequency control data is preset in the down counter 6.

After that, as the control signal PA is changed again from High level to Low level and the pulse circulating operation of the ring oscillator 2 is stopped, the register 8 is reset and the input signal CST is changed from High level to Low level, thus completing the initial setting. The set signal SET from the OR gate 14 becomes Low level at this time.

Then, when the control signal PA is changed from Low level to High level after implementing the initial setting as described above, the oscillation operation of the apparatus is started.

Now the oscillation operation of the digital control oscillator of the present embodiment will be explained with reference to FIG. 4 and a case when "0001" indicating 1 is input as the low order 4 bit CDL of the frequency control data.

Figure 4:
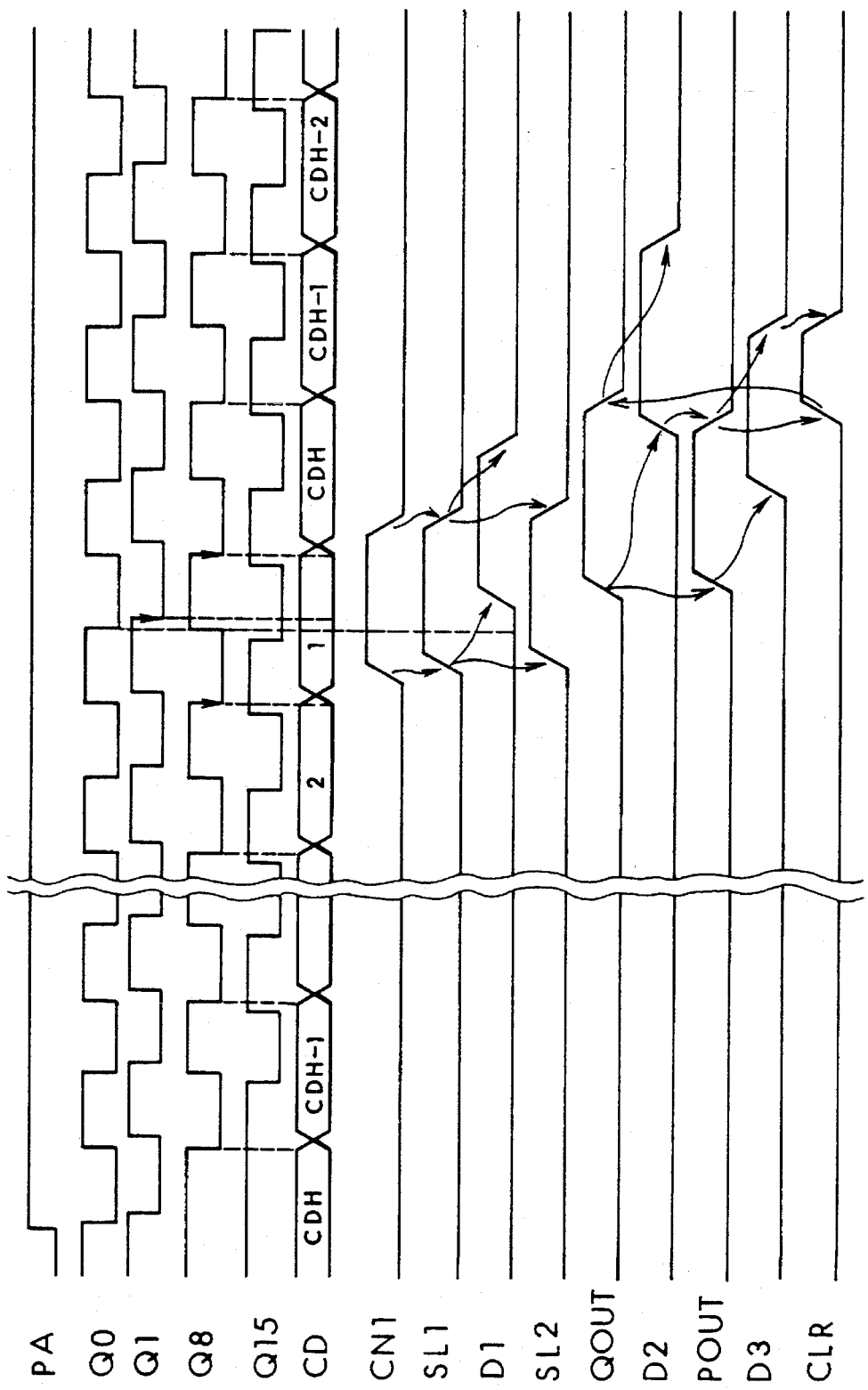
FIG. 4 is a time chart showing operations when a data value of the four least significant bits of frequency control data input from the outside is 1.

Here, FIG. 4 shows a state from the starting of the oscillation operation of the apparatus to the operation in the second cycle. In FIG. 4, it is assumed that the value of the high order 10 bit CDH of the frequency control data is preset in the down counter 6 beforehand by the initial setting described above and CD indicates the count value of the down counter 6.

As shown in FIG. 4, the ring oscillator 2 starts the pulse signal circulating operation when the control signal PA is changed from Low level to High level and a pulse signal whose one cycle is the period of time (32 * Td) necessary for the main edge to go around the ring oscillator 2 once and whose phase is delayed by 2 * Td is output from each of the output terminals Q0 through Q15. Then because the low order 4 bit CDL of the frequency control data is "0001", the pulse signal from the output terminal Q1 is output from the pulse selector 4 as the output signal PSO. Accordingly, in this case, a pulse signal whose phase is delayed by 2 * Td * CDL=2 * Td as compared to the pulse signal output from the output terminal Q0 is input to the DFF 20.

On the other hand, the down counter 6 down counts from the preset initial value CDH every time the pulse signal (clock signal CLK) from the output terminal Q8 on the ring oscillator 2 decays, i.e. every period of time (32 * Td) which the main edge of the pulse signal takes to go around the ring oscillator 2, and turns the output signal CN1 to High level when its count value becomes 1 and turns the output signal CN0 to High level when the count value becomes 0.

At this time, because the carry signal CY from the adder 10 is at Low level immediately after when the control signal PA has been changed from Low level to High level, the selector 12 selects and outputs the output signal CN1 between the output signals CN1 and CN0 of the down counter 6. Further, because the MSB of the control data CDLN output from the adder 10 is 0 at this time, the selector 18 selects and outputs the output signal SL1 between the output signal SL1 of the selector 12 and the delay signal D1 from the delay line 16.

Accordingly, the output signal SL2 of the selector 18, i.e. data input to the DFF 20, changes from Low level to High level when the pulse signal (clock signal CLK) from the output terminal Q8 decays and the count value of the down counter 6 becomes 1 as shown in FIG. 4.

Then, when the output signal PSO of the pulse selector 4, i.e., the pulse signal output from the output terminal Q1 of the ring oscillator 2, decays after the output signal SL2 of the selector 18 has changed to High level, the latch signal QOUT of the DFF 20 turns to High level and the output signal POUT of the apparatus changes to High level.

Here, when a predetermined time T2 passes after when the latch signal QOUT of the DFF 20 has changed to High level as shown in FIG. 4, the delay signal D2 of the delay line 22 changes to High level, so that the output signal POUT of the apparatus returns to Low level. Then the output signal of the AND gate 28, i.e. a clear signal CLR of the DFF 20, becomes High level, resetting the DFF 20. Further, when a predetermined time T3 passes after when the output signal POUT has returned to Low level, a delay signal D3 of the delay line 26 changes to Low level, so that the clear signal CLR returns to Low level, releasing the reset of the DFF 20. That is, the output signal POUT is output at High level only by the delay time T2 of the delay line 22 after when the latch signal QOUT of the DFF 20 has changed to High level and the DFF 20 is reset when the output signal POUT returns to Low level.

The above operation is performed from when the control signal PA has been changed to High level until when the output signal POUT changes to High level for the first time, i.e., the operations in the first cycle of the apparatus.

Next, operation in the second cycle of the apparatus will be explained.

When the output signal POUT changes from Low level to High level as described above, 4 bit data obtained by adding control data CDLN currently input to the pulse selector 4 with the low order 4 bit CDL of the frequency control data is input to the pulse selector 4 as new control data CDLN by the register 8 and adder 10.

Accordingly, in the operation of the second cycle when "0001" is input as the low order 4 bit CDL of the frequency control data, control data CDLN "0010" is input to the pulse selector 4 and a pulse signal output from the output terminal Q2 of the ring oscillator 2 is input as a clock of the DFF 20.

On the other hand, because the set signal SET from the OR gate 14 becomes High level when the output signal SL1 of the selector 12 turns to High level, the high order 10 bit CDH of the frequency control data is preset again to the down counter 6 when the pulse signal (clock signal CLK) from the output terminal Q8 decays immediately after that. When the CDH is preset in the down counter 6, the output signal SL1 of the selector 12 returns to Low level.

After that, the down counter 6 down counts with a timing of decay of the clock signal CLK. When the pulse signal output from the output terminal Q2 of the ring oscillator 2 decays this time after when the count value has become 1 and the output signal SL2 of the selector 18 has changed to High level, the latch signal QOUT of the DFF 20 changes to High level and the output signal POUT of the apparatus turns to High level.

In operations on and after the third cycle, the control data CDLN input to the pulse selector 4 increases one by one like "0011", "0100", "0101", . . . every time the output signal POUT turns to High level and the pulse signals from the output terminals Q3, Q4, Q5, . . . are input sequentially as a clock of the DFF 20. Other operations are the same as those in the second cycle.

That is, according to the digital control oscillator of the present embodiment, the down counter 6 detects that the main edge has been output CDH times from the output terminal Q8 of the ring oscillator 2 and after the detection changes the output signal POUT to High level when the main edge is output from the output terminal selected by the pulse selector 4. The control data CDLN for selecting the output terminal by the pulse selector 4 is updated every time the output signal POUT changes to High level (per one cycle) by accumulating and adding the low order 4 bit CDL of the frequency control data.

Accordingly, in the digital control pulse generator of the present embodiment, the output terminal to be selected by the pulse selector 4 shifts to the later or higher stage by the value of CDL per one cycle and the High level output signal POUT is output from the apparatus per each time (32 * Td * CDH+2 * Td * CDL) in which a period of time necessary for the main edge of the pulse signal to go around the ring oscillator 2 by a number of times specified by the high order 10 bit CDH of the frequency control data (32 * Td * CDH) and a period of time in which two stages of inversion circuits of the delay time is multiplied with the low order 4 bit CDL of the frequency control data (2 * Td * CDL) are added.

For example, when "0001" is input as the low order 4 bit CDL of the frequency control data as described above, the High level output signal POUT is output per each (32 * Td * CDH+2 * Td). When the control data DCLN is updated as described above and its MSB becomes 1, the selector 18 selects and outputs the delay signal D1 among the output signal SL1 of the selector 12 and the delay signal D1 from the delay line 16.

This is because the clock might decay in the DFF 20 immediately after when the data has changed when the pulse signals from the output terminals Q8 through Q15 are input as the clock of the DFF 20, making the latch signal QOUT uncertain.

Then, in the digital control pulse generator of the present embodiment, the output signal SL1 of the selector 12 is inputted as data of the DFF 20 as it is when the MSB of the control data CDLN is 0, i.e., when the pulse signals from the output terminals Q0 through Q7 are input as the clock of the DFF 20 and conversely the output signal SL1 of the selector 12 is inputted as data of the DFF 20 by delaying by the time T1 necessary for the pulse signal to go around a half of the ring oscillator 2 when the MSB of the control data CDLN is 1, i.e., when the pulse signals from the output terminals Q8 through Q15 are inputted as the clock of the DFF 20. Thereby a time from when the data of the DFF 20 has changed to High level until when the clock of the DFF 20 decays is always made to be more than the time for the pulse signal to go around a half of the ring oscillator 2.

Further, when the control data CDLN is updated and the addition result in the adder 10 exceeds "1111" the carry signal CY turns to High level, so that the selector 12 outputs the output signal CN0 among the output signals CN1 and CN0 of the down counter 6.

This is caused by the following: because the down counter 6 down counts always with a constant cycle (32 * Td) by the clock signal CLK output from the output terminal Q8 of the ring oscillator 2, the oscillation cycle becomes short by the time for the pulse signal to go around the ring oscillator 2 once when the output terminal of the B ring oscillator 2 from which the pulse signal is taken out this time becomes the preceding stage from the output terminal from which the pulse signal has been taken out in the previous time, i.e. when the value of the control data CDLN input to the pulse selector 4 becomes smaller than the previous value.

Then, in the digital control oscillator of the present embodiment, the selector 12 is adapted to select the output signal CN0 of the down counter 6 only when the carry signal CY output from the adder 10 is High level to increase the count number which the down counter 6 counts a number of times of circulation of the pulse signal until when the High level data is input to the DFF 20 substantially by one time.

Accordingly, when "0001" is input as the low order 4 bit CDL of the frequency control data as described above for example, although the control data CDLN input to the pulse selector 4 increases sequentially one by one like "0001", "0010", ... "1111", "0000", "0001" per each cycle, the carry signal CY turns to High level only when the control data DCLN changes from "1111" to "0000", so that no high level data is input to the DFF 20 until the counter value of the down counter 6 becomes 0.

Now a case when "1111" indicating 15 is inputted as the low order 4 bit CDL of the frequency control data will be explained with reference to FIG. 5.

Figure 5:
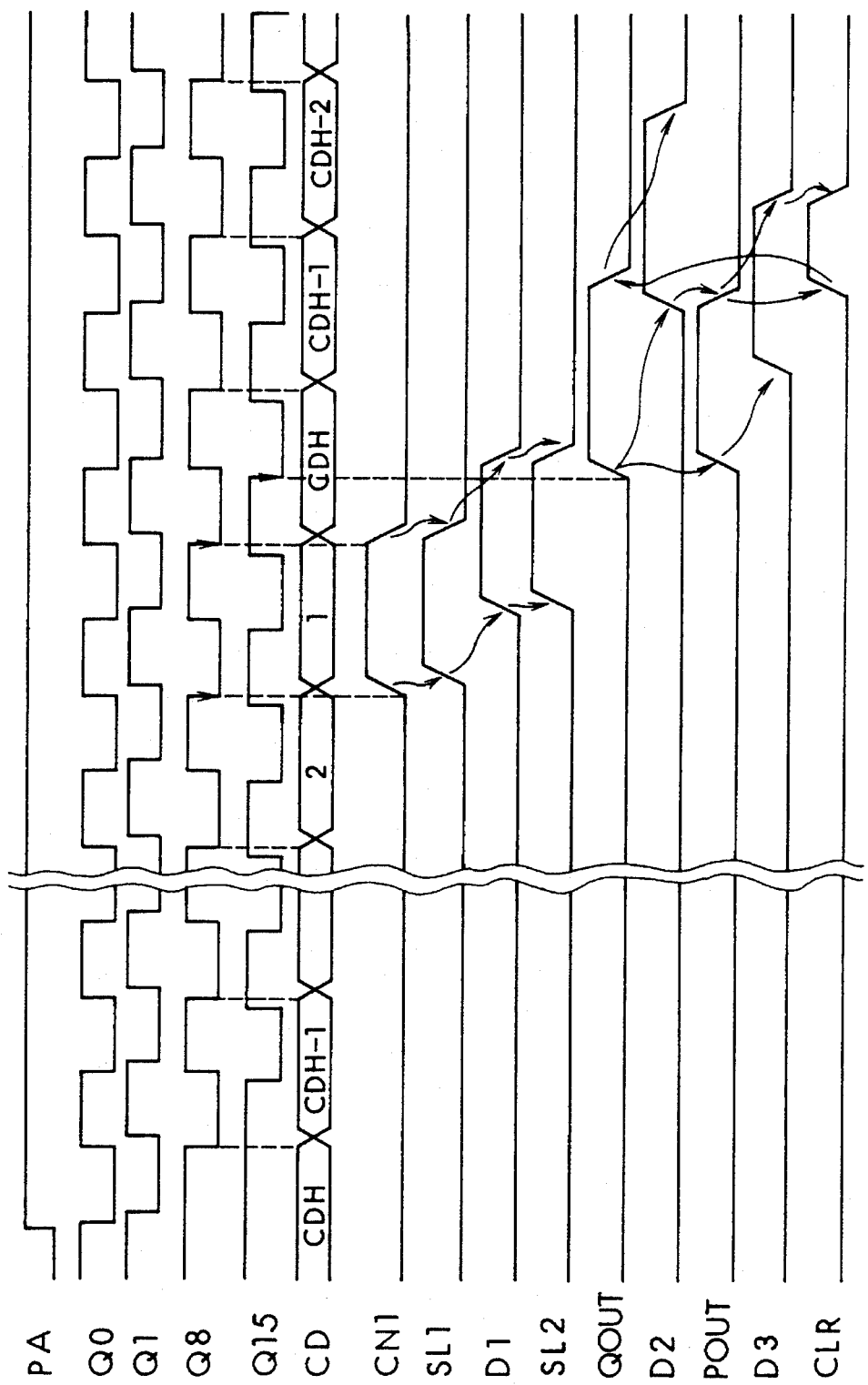
FIG. 5 is a time chart showing operations when a data value of the four least significant bits of frequency control data input from the outside is 15.

As shown in FIG. 5, because the MSB of the control data CDLN is 1 from the beginning in this case, the selector 18 outputs the delay signal D1 of the delay line 16 as an output signal SL2 to the DFF 20 from the first cycle of the oscillation operation. The operations are the same as those shown in FIG. 4 except that the latch signal QOUT and output signal POUT change to High level at the timing of decay of the pulse signal from the output terminal Q15.

When "1111" is thus inputted as the low order 4 bit CDL, the control data CDLN inputted to the pulse selector 4 increases sequentially by 15 like "0001", "1110", ... "0001", "0000", "1111" per each cycle and the pulse signals from the output terminals Q15, Q14, ... Q1, Q0, Q15, ... of the ring oscillator 2 are selected sequentially as the clock of the DFF 20. Further, because the carry signal CY turns to High level and the selector 12 selects the output signal CN0 of the down counter 6 in cases other than when the control data CDLN turns from "0000" to "1111", the count number counted by the down counter 6 is increased substantially by one time. Then the High level output signal POUT is output per each time (32 * Td * CDH+ 2 * Td * 15) in which a time necessary for the pulse signal to go around the ring oscillator 2 by a CDH times (32 * Td * CDH) and a time in which two stages of inversion circuits of the delay time is multiplied with the value of CDL (2 * Td * 15) are added.

As described above, in the digital control pulse generator of the present embodiment, the down counter 6 counts a number of times when the main edge is output from the output terminal Q8 of the ring oscillator 2 to detect whether the number of times of circulation of the pulse in the ring oscillator 2 has reached the high order 10 bit CDH of the frequency control data and after the detection the output signal POUT is changed to High level when the main edge of the pulse signal has arrived at the output terminal selected by the pulse selector 4. Then the control data CDLN for selecting the output terminal by the pulse selector 4 is set by accumulating and adding the low order 4 bit CDL of the frequency control data every time the output signal POUT changes to High level and when the value of the control data CDLN becomes smaller than the previous value, the down counter 6 is adapted to down count down to zero to prevent the oscillation cycle from being shortened by the time for the pulse signal to go around the ring oscillator 2.

That is, in the digital control pulse generator of the present embodiment, the period of time from when the number of times of circulation of the pulse signal has reached the CDH is detected by the main edge from the output terminal Q8 until when the output signal POUT is changed to High level is delayed by the period of time in which the delay time of two inversion circuits is multiplied with the CDL (2 * Td * CDL) per each cycle. Thereby the high level output signal POUT may be output with the oscillation cycle corresponding to the frequency control data CDH and CDL continuously operating the ring oscillator 2 without temporarily stopping it.

As described above, the digital control pulse generator of the present embodiment allows arbitrary adjustment of the output cycle (oscillation cycle of the apparatus) of the output signal POUT by changing the frequency control data CDH and CHL input from the outside. Further, because it allows coarse determination of the oscillation cycle by the count of the down counter 6, i.e. by the high order 10 bit CDH of the frequency control data and to finely adjust the cycle by the low order 4 bit CDL of the frequency control data in units of the inversion operating time of two inversion circuits 2 * Td, so that the oscillation cycle can be digitally controlled over a wide range and with high resolution.

Further, according to the digital control pulse generator of the present embodiment, the ring oscillator 2 is composed of 32 inversion circuits and is arranged so that the pulse signals are taken out alternatively only from the delay line 16 odd stage inversion circuits respectively connected at equal intervals, so that the low order 4 bit CDL of the frequency control data may be directly used as data specifying the inversion circuit for taking out the pulse signal and the high order 10 bit CDH of the frequency control data may be directly used as data specifying the number of times of circulation of the pulse signal. Further, because the time difference between each pulse signal is uniform, the oscillation cycle may be controlled with a uniform resolution.

In particular, because the ring oscillator 2 may be operated to oscillate without stopping in the digital control pulse generator of the present embodiment as described above, the oscillation cycle may be set proportional to the value of the frequency control data, thus enhancing the controllability a great deal. Further, because it is not necessary to stop the ring oscillator 2, the oscillation cycle may be set shorter.

In the digital control pulse generator of the present embodiment, the value of the frequency control data CDH and CDL may be changed before the output signal POUT changes to High level in the case of the low order 4 bit CDL and after when the down counter 6 has been preset in the case of the high order 10 bit CDH.

Here, because the oscillation cycle is controlled utilizing the inversion operating time of each inversion circuit composing the ring oscillator 2 in the digital control pulse generator of the present embodiment, the oscillation cycle may be changed by the operational environment such as a power voltage and ambient temperature. Therefore, means for correcting the oscillation frequency is necessary when it is desirable that the oscillation cycle of the output signal POUT be controlled in absolute time.

As a method for correcting the oscillation frequency, while it is conceivable to produce a reference oscillation signal beforehand by a quartz oscillator or the like for example and to control a power voltage of the apparatus so that the oscillation frequency of the reference oscillation signal coincides with an oscillation frequency of a signal produced by dividing the clock signal CLK from the output terminal Q8 of the ring oscillator 2 or to correct the value of the frequency control data, such correction control may be carried out accurately in the digital control pulse generator of the present embodiment because there is no offset error of the oscillation cycle caused by the temporary stoppage of the ring oscillator 2 as in the prior art apparatus described above.

The present invention should not be limited to the embodiment described above but may be modified in many ways.

Figure 6:
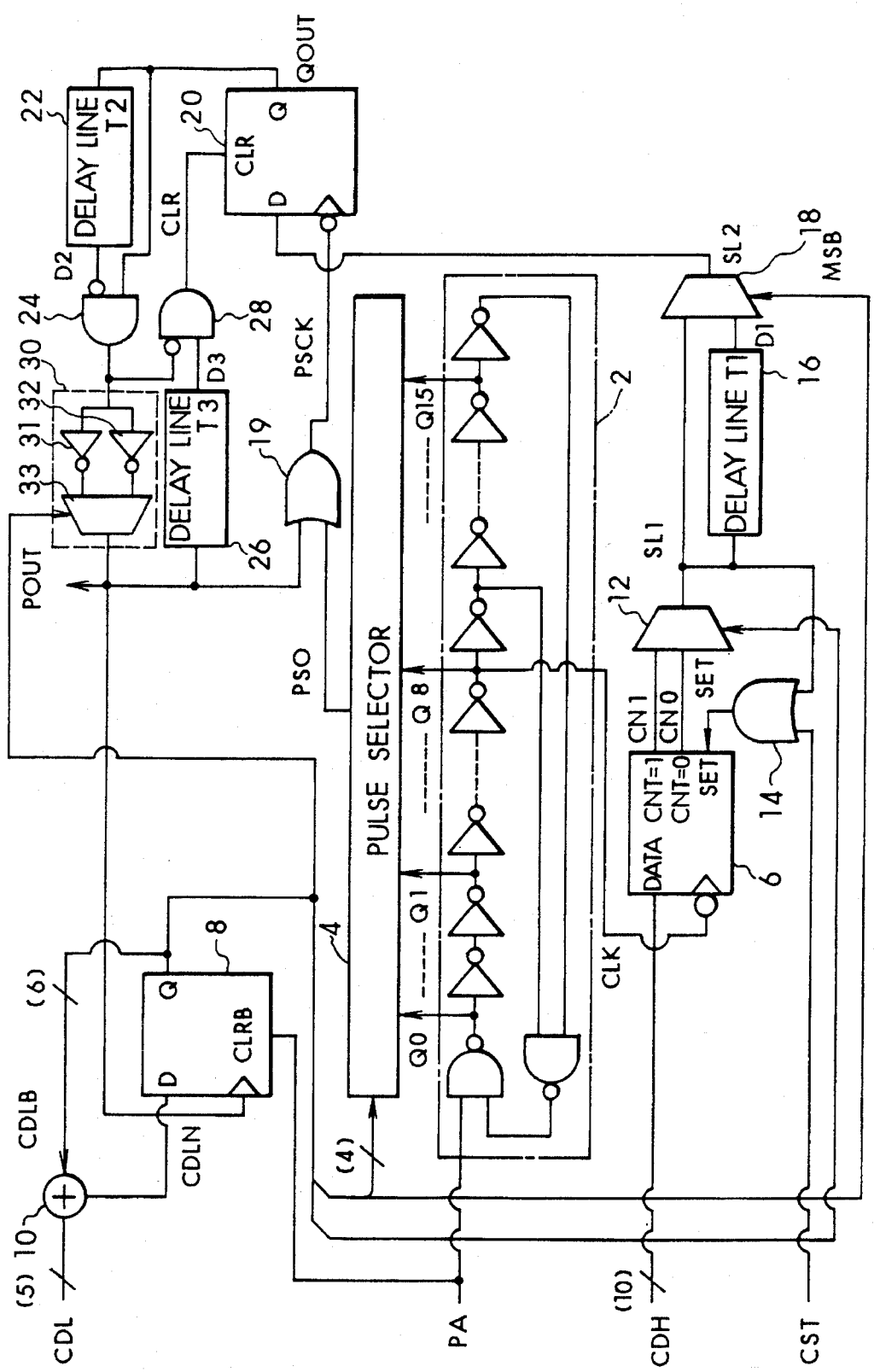
FIG. 6 is a block diagram of another embodiment of the present invention.

One exemplary modified embodiment is shown in FIG. 6. and description thereof will be made with respect to its modified parts from the foregoing embodiment.

In this embodiment, output teminal Q of the register 8 as memory means is connected to the pulse selector 4 and the selector 12. By this arrangement, when the frequency control data CDL is changed, such data is fixed or stabilized by the adder 10 and the register 8 and is output to pulse selector 4 and the selector 12.

Thus, since signals are selected under the stabilized condition by the selectors 4 and 12, circuit operation is stabilized more than in the embodiment of FIG. 1.

In addition, a time resolution enhancement circuit 30 is connected between the output terminal POUT and the AND gate 24. The circuit 30 compreses two inverters 31 and 32 having different delay times relative to each other and a selector 33 for switching operativeness of the inverters 31 and 32. The inverters 31 and 32 are so designed that the delay time due to the difference in the signal transmission paths becomes equal to one delay time of the two inverters INV2 of the pulse circulating circuit or ring oscillator 2. That is, transistor sizes of the inverters 31 and 32 are made different from each other so that the delay time due to the path difference becomes one half (Td) of the inversion operation time (2 * Td) of each pulse signal Q1, Q2, or the like generated by the ring oscillator 2. To the selector 32, the lowermost bit data (CDLB1) of data CDLB is also input to the selector 33 from output terminal Q of the register 8. Other lower bit data (CDLB2 through CDLB5) from the output Q of the register 8 is connected to the selectors 4 and 12.

Thus, since the minimum or finest time resolution of the final output signal POUT is one half (Td) of the inversion operation time (2 * Td) of two inverters in the ring oscillator 2, the finest time resolution of the output signal POUT can be made twice as high as that in the embodiment of FIG. 1. It is to be noted in FIG. 6 that the lowermost bit data is added for the finest time (Td) resolution control.

What is claimed is:

1. A digital control pulse generator which allows digital control of a transmission cycle of an output signal therefrom by transmission cycle control data and a starting control signal to be inputted thereto, said generator comprising:

a pulse circulating circuit composed of a plurality of inversion circuits each for inverting said input signal to output as said output signal and linked in a ring, one of said inversion circuits being a start-up inversion circuit by which an operation for inverting its respective input signal is controlled by said starting control signal, said pulse circulating circuit circulating a pulse signal composed of said output signal of each of said inversion circuits within said inversion circuits linked in a ring starting with an inverting operation of said start-up inversion circuit effected by said starting control signal inputted to said start-up inversion circuit;

pulse selecting means for inputting a first linked position input data indicating a linked position of a specific inversion circuit starting from said start-up inversion circuit within said pulse circulating circuit to take out and output an output pulse signal from output signals of the inversion circuits within said pulse circulating circuit selected according to said first linked position input data;

output means for outputting said output signal when said pulse selecting means takes out and outputs said output pulse signal corresponding to said first linked position input data;

memory means for storing said first linked position input data input to said pulse selecting means as second linked position input data when said output signal is output by said output means; and position data updating means for adding said second linked position input data stored in said memory means and a newly inputted transmission cycle control data to output digital data after addition as said first linked position input data inputted by said pulse selecting means.

2. The digital control pulse generator according to claim 1, wherein said position data updating means subtracts from the second linked position input data the number of said inversion circuits of said pulse circulating circuit for providing said first linked position input data when a linked position of a specific inversion circuit indicated by said first linked position input data after an addition output exceeds a linked position of the inversion circuit linked at a final stage of said pulse circulating circuit.

3. A digital control pulse generator which allows digital control of a transmission cycle of an output signal thereof by transmission cycle control data and a starting control signal, said generator comprising:

a pulse circulating circuit composed of a plurality of inversion circuits each for inverting an input signal to output as said output signal and linked in a ring, one of said inversion circuits being a start-up inversion circuit by which an operation for inverting its respective input signal is controlled by said starting control signal, said pulse circulating circuit circulating a pulse signal composed of said output signal of each of said inversion circuits within said inversion circuits linked in a ring starting with an inverting operation of said start-up inversion circuit effected by said starting control signal inputted to said start-up inversion circuit;

pulse selecting means for inputting a first linked position input data indicating a linked position of a specific inversion circuit starting from said start-up inversion circuit within said pulse circulating circuit to take out and output an output pulse signal from output signals of the inversion circuits within said pulse circulating circuit selected according to said first linked position input data;

counting means for counting the pulse signal output from said specific inversion circuit located at the linked position within said pulse circulating circuit as a count value to detect that the count value has reached the digital data indicating a number of times of circulation of the pulse signal among said transmission cycle control data and transmission cycle control data;

output means for outputting said output signal when said pulse selecting means takes out and outputs said output pulse signal corresponding to said first linked position input data after a detection made by said counting means that said count value has reached the digital data indicating the number of times of circulation of the pulse signal;

memory means for storing said first linked position input data input to said pulse selecting means as a second linked position input data when said output signal is output by said output means;

position data updating means for adding the second linked position input data stored in said memory means and the first linked position input data indicating the linked position of the specific inversion circuit from said start-up inversion circuit within said pulse circulating circuit and for outputting a result thereof as digital data after addition as said first linked position input data inputted by said pulse selecting means; and count changing means for incrementing a count of said counting means by one before said counting means detects that said count value has reached the digital data indicating the number of times of circulation of the pulse signal when the linked position of said specific inversion circuit indicated by the first linked position input data outputted from said position data updating means exceeds a linked position of an inversion circuit linked immediately before said start-up inversion circuit.

4. The digital control pulse generator according to claim 3, wherein said pulse circulating circuit is composed of an even number of inversion circuits linked at equal intervals, said pulse selecting means is arranged so as to take out the output pulse signal from the output signal of the inversion circuit alternatively selected from the predetermined $2^n$ inversion circuits among said even number of inversion circuits, and the linked position input data indicating the linked position of each said inversion circuit starting from said start-up inversion circuit within said pulse circulating circuit is composed of said n number of bits.

5. A digital control pulse generator according to claim 3, wherein said output pulse signal taken out from said pulse selecting means falls at substantially midpoint of risings of an output signal and its delayed signal.

6. A digital control pulse generator which allows digital control of a transmission cycle of an output signal by transmission cycle control data and starting control signal inputted thereto, said generator comprising:

a pulse circulating circuit composed of a plurality of inversion circuits each for inverting an input signal to output as an output signal and linked in a ring, one of said inversion circuits being a start-up inversion circuit by which an operation for inverting its respective input signal is controlled by said starting control signal, said pulse circulating circuit circulating a pulse signal composed of respective output signals of said inversion circuits within said inversion circuits linked in a ring starting with an inverting operation of said start-up inversion circuit effected by said starting control signal inputted to said start-up inversion circuit;

pulse selecting means for inputting a first linked position input data indicating a linked position of a specific inversion circuit starting from said start-up inversion circuit within said pulse circulating circuit to take out and output an output pulse signal from output signals of the inversion circuits within said pulse circulating circuit selected according to said first linked position input data;

counting means for counting the pulse signal output from said specific inversion circuit located at the linked position within said pulse circulating circuit as a count value to detect that the count value has reached the digital data indicating a number of times of circulation of the pulse signal among said transmission cycle control data and transmission cycle control data;

output means for outputting said output signal for a certain period of time when said pulse selecting means takes out and outputs said output pulse signal corresponding to said first linked position input data after a detection made by said counting means that said count value has reached the digital data indicating the number of times of circulation of the pulse signal;

memory means for storing said first linked position input data input to said pulse selecting means as a second linked position input data when said output signal is output by said output means;

position data updating means for adding the second linked position input data stored in said memory means and the first linked position input data indicating the linked position of the specific inversion circuit starting from said start-up inversion circuit within said pulse circulating circuit among newly inputted transmission cycle control data and to output digital data as said first linked position input data inputted by said pulse selecting means; and count changing means for incrementing a count of said counting means by one when the linked position of said specific inversion circuit indicated by the first linked position input data after an addition outputted from said position data updating means exceeds a linked position of an inversion circuit linked immediately before said start-up inversion circuit.

7. A digital control pulse generator which allows digital control of a transmission cycle of an output signal therefrom by transmission cycle control data and a starting control signal to be inputted thereto, said generator comprising:

a pulse circulating circuit composed of a plurality of inversion circuits each for inverting said input signal to output as said output signal and linked in a ring, one of said inversion circuits being constructed as said start-up inversion circuit by which an operation for inverting its respective input signal is controlled by a starting control signal, said pulse circulating circuit circulating a pulse signal composed of said output signal of each of said inversion circuits within said inversion circuits linked in a ring starting with an inverting operation of said start-up inversion circuit effected by said starting control signal inputted to said start-up inversion circuit;

pulse selecting means for inputting first position input data corresponding to said transmission cycle control data and indicating a position of a specific inversion circuit starting from said start-up inversion circuit within said pulse circulating circuit to take out and output a output pulse signal from the output signals of the inversion circuits within said pulse circulating circuit alternatively selected according to said first position input data;

output means for outputting said output signal when said pulse selecting means takes out and outputs said output pulse signal corresponding to said first position input data; and time resolution enhancement circuit means, connected to said pulse selecting means and said output means, including a pair of inverter circuits and a selector, said pair of inverter circuits having different delay times a difference of which is equal to a delay time of one of said inverter circuits in said pulse circulating circuit, and said selector selecting one of said inverter circuits in said pair so that said output signal has a finest time resolution of the time delay equal to that of said one of said inverter circuits in said pulse circulating circuit.

8. A digital control pulse generator which allows digital control of a transmission cycle of an output pulse signal therefrom by transmission control data provided thereto, said generator comprising:

a pulse circulating circuit including a plurality of inverters connected in a ring, each of which is for receiving a corresponding inverter input signal and inverting said corresponding input signal to generate a corresponding inverter output signal, said pulse circulating circuit circulating a pulse signal within said ring; and a control circuit controlling said pulse circulating circuit, said control circuit including a memory storing first linked position input data indicating a linked position of a specific inversion circuit within said pulse circulating circuit;

pulse selecting means for reading said first linked position input data stored in said memory and generating said output pulse signal responsive to an inverter output signal generated by said specific inverter; and position data updating means for reading said first linked position data stored in said memory, receiving second linked position data representative of a number of inverter circuits in said pulse circulating circuit, and storing a sum of said first and second linked position data in said memory as said first linked position data.

9. The digital control pulse generator of claim 8, wherein said pulse selecting means reads said first linked position input data from said memory and said position data updating means stores said sum in said memory substantially simultaneously.

10. The digital control pulse generator of claim 8, wherein said pulse selecting means reads said first linked position input data from said memory after said position data updating means stores said sum in said memory.

11. A digital control pulse generator which allows digital control of a transmission cycle of an output pulse signal therefrom by transmission control data provided thereto, said generator comprising:

a pulse circulating circuit including a plurality of inverters connected in a ring, each of which is for receiving a corresponding inverter input signal and inverting said corresponding input signal to generate a corresponding inverter output signal, one of said inverters being a start-up inverter, said pulse circulating circuit circulating a pulse signal within said ring beginning with an inverter output signal generated by said start-up inverter; and a control circuit controlling said pulse circulating circuit, said control circuit including a memory storing first linked position input data indicating a linked position of a specific inversion circuit within said pulse circulating circuit;

pulse selecting means for reading said first linked position input data stored in said memory and generating said output pulse signal responsive to an inverter output signal generated by said specific inverter; and position data updating means for reading said first linked position data stored in said memory, receiving second linked position data representative of a position of said specific inverter from said start-up inverter, and storing a sum of said first and second linked position data in said memory as said first linked position data.

12. A digital control pulse generator which allows digital control of a transmission cycle of an output pulse signal therefrom by transmission control data provided thereto, said generator comprising:

a pulse circulating circuit including a plurality of inverters connected in a ring, each of which is for receiving a corresponding inverter input signal and inverting said corresponding input signal to generate a corresponding inverter output signal, one of said inverters being a start-up inverter, said pulse circulating circuit circulating a pulse signal within said ring beginning with an inverter output signal generated by said start-up inverter; and a control circuit controlling said pulse circulating circuit, said control circuit including a memory storing first linked position input data indicating a linked position of a specific inversion circuit within said pulse circulating circuit;

pulse selecting means for reading said first linked position input data stored in said memory and generating said output pulse signal responsive to an inverter output signal generated by said specific inverter; and position data updating means for reading said first linked position data stored in said memory, receiving second linked position data representative of a position of said specific inverter from said start-up inverter, and storing a sum of said first and second linked position data in said memory as said first linked position data.

13. The digital control pulse generator of claim 12, further comprising second position data updating means for, when said sum exceeds a linked position of a final inverter in said pulse circulating circuit, storing a difference between said sum and a number of inverters in said pulse circulating circuit in said memory as said first linked position data.

14. The digital control pulse generator of claim 12, wherein:

said ring includes an even number of inverters;

said pulse selecting means selects an inverter output generated by one of $2^n$ inverters in said ring; and said first linked position data includes n bits.

15. A digital control pulse generator which allows digital control of a transmission cycle of an output pulse signal therefrom by a starting control signal provided thereto, said generator comprising:

a pulse circulating circuit including a plurality of inverters connected in a ring, each of which is for receiving a corresponding inverter input signal and inverting said corresponding input signal to generate a corresponding inverter output signal, one of said inverters being a start-up inverter, said pulse circulating circuit circulating a pulse signal within said ring beginning with an inverter output signal generated by said start-up inverter responsive to said starting control signal; and a control circuit controlling said pulse circulating circuit, said control circuit including a memory storing first linked position input data indicating a linked position of a specific inversion circuit within said pulse circulating circuit;

pulse selecting means for reading said first linked position input data stored in said memory and generating a selected output signal responsive to an inverter output signal generated by said specific inverter;

a counter maintaining a count of said selected output signal and detecting when said count reaches a predetermined value;

output means for generating said output pulse signal for a predetermined period of time responsive to said selected output signal and responsive to a detection by said counter;

position data updating means for reading said first linked position data stored in said memory, receiving second linked position data representative of a position of said specific inverter from said start-up inverter, and providing a sum of said first and second linked position data in said memory as said first linked position data; and count changing means for incrementing said count until said first linked position input data exceeds a linked position of an inverter immediately preceding said start-up inverter.

16. A digital control pulse generator which allows digital control of a transmission cycle of an output pulse signal therefrom by a starting control signal provided thereto, said generator comprising:

a pulse circulating circuit including a plurality of inverters connected in a ring, each of which is for receiving a corresponding inverter input signal and inverting said corresponding input signal to generate a corresponding inverter output signal, one of said inverters being a start-up inverter, said pulse circulating circuit circulating a pulse signal within said ring beginning with an inverter output signal generated by said start-up inverter responsive to said starting control signal; and a control circuit controlling said pulse circulating circuit, said control circuit including pulse selecting means for receiving first linked position input data indicating a linked position of a specific inversion circuit within said pulse circulating circuit and generating a selected output signal responsive to an inverter output signal generated by said specific inverter;

a counter maintaining a count of said selected output signal and detecting when said count reaches a predetermined value;

output means for generating said output pulse signal for a predetermined period of time responsive to said selected output signal and responsive to a detection by said counter;

a memory temporarily storing said first linked position input data and providing said stored first linked position data to said pulse selecting means when said output means generates said output pulse signal;

position data updating means for reading said first linked position data stored in said memory, receiving second linked position data representative of a position of said specific inverter from said start-up inverter, and providing a sum of said first and second linked position data in said memory as said first linked position data; and count changing means for incrementing said count until said first linked position input data exceeds a linked position of an inverter immediately preceding said start-up inverter.

* * * * *